United States Patent [19]

Wu et al.

[11] Patent Number: 5,255,346
[45] Date of Patent: Oct. 19, 1993

[54] METHOD AND APPARATUS FOR DESIGN OF A VECTOR QUANTIZER

[75] Inventors: Frank H. Wu, Aurora; Kalyan Ganesan, Englewood, both of Colo.

[73] Assignee: U S West Advanced Technologies, Inc., Boulder, Colo.

[21] Appl. No.: 458,158

[22] Filed: Dec. 28, 1989

[51] Int. Cl.$^5$ .......................... G06F 15/46; H04N 9/32
[52] U.S. Cl. .......................................... 395/23; 395/26; 395/27; 364/807; 358/136
[58] Field of Search ............................... 381/36, 40, 43; 358/261.21, 133, 135, 136; 375/122; 364/131, 513–515, 807; 395/23, 26, 27

[56] References Cited

U.S. PATENT DOCUMENTS

| | | | |
|---|---|---|---|
| 3,436,752 | 4/1969 | Pihl . | |
| 4,558,350 | 12/1985 | Murakami | 358/133 |
| 4,560,977 | 12/1985 | Murakami et al. | 364/807 |
| 4,670,851 | 6/1987 | Murakami et al. | 358/136 |
| 4,754,258 | 6/1988 | Nakamura et al. | 341/51 |
| 4,809,067 | 2/1989 | Kikuchi et al. | 358/135 |
| 4,866,645 | 9/1989 | Lish | 364/131 |
| 4,922,508 | 4/1990 | Moyiga | 375/122 |

OTHER PUBLICATIONS

Linde, "An Algorithm for Vector Quantizer Design," *IEEE Transactions on Communications*, vol. Com-28, No. 1, Jan. 1980, pp. 84–95.

Lippmann, "An Introduction to Computing with Neural Nets," *IEEE Acoustic, Speech and Signal Processing Magazine*, Apr. 1987, pp. 4–22.

F. Wu et al., "An Algorithm for Robust Vector Quantization using a Neural-Net Model," IEEE International Conference on Neural Networks, San Diego, California, Jul. 24, 1988.

*Primary Examiner*—Michael R. Fleming
*Assistant Examiner*—George Davis
*Attorney, Agent, or Firm*—Timothy R. Schulte

[57] ABSTRACT

A method and apparatus for the design of a robust vector quantizer is disclosed. The initial output vector set is equal to the centroid of a training sequence of input vectors. A neural-network simulation and neighborhood functions are utilized for splitting and optimizing the output vectors. In this manner, the entire output vector set is sensitive to each input vector and therefore optimal output vector locations with respect to specified distortion criteria are obtained. The resulting vector quantizer is robust for the class of signals represented by the training sequence.

19 Claims, 8 Drawing Sheets

METHOD AND APPARATUS FOR DESIGN OF A VECTOR QUANTIZER

TECHNICAL FIELD

This invention is directed toward a method and apparatus for design of vector quantizers and, more particularly to a method for design using a neural-network model to produce a robust vector quantizer.

BACKGROUND OF THE INVENTION

A vector quantizer is a coding/decoding method and apparatus for representing data in a highly compact form for transmission or storage purposes. The vector quantizer can also reconstruct a close approximation of the original data when necessary. The process of coding data via a vector quantizer is referred to as vector quantization.

Conceptually, a vector quantizer operates by accepting a large set of input vectors and, in lieu of transmitting or storing each vector, the vector quantizer chooses the nearest approximation to each input vector from a set of predetermined output vectors and transmits or stores the output vector's representation. To state it another way, vector quantization is a mapping of input vectors to a set of output vectors. Further, instead of transmitting or storing the entire output vector, it is generally the case that a code which represents the output vector is employed. For example, if the total number of output vectors in an output set is 128, then a binary code with as few as 7 bits is used to identify a particular output vector. Similarly, if the output vector set contains 256 vectors, then a binary code of at least 8 bits is required.

The relationships between the input vectors, the output vectors and the binary code comprise a codebook. Using this codebook, the original input signal is associated to an output vector which can be coded into the binary code and transmitted or stored. Reconstruction of the original signal is then accomplished by the receiving or retrieval of the binary code. By use of the codebook once again, the binary code will map to the appropriate output vector. It will be appreciated that the receiver does not reconstruct the exact original input signal, but rather a very close approximation.

Recently, vector quantization has received considerable attention due to the dramatic bit rate reduction it can produce for complex signals while retaining high (original) quality and intelligibility. In particular, signals that have a high level of redundancy are extremely susceptible to vector quantization data compression methods. A set of signal input vectors is considered to have a high level of redundancy if the vectors tend to form "clusters" in an N-dimensional signal input vector space, where N is the number of scalar elements comprising an input vector. Clustering is defined as the grouping of vectors close to one another in the vector space. Therefore, in the N-dimensional vector space, certain regions contain large concentrations of signal input vectors. Clustering may be contrasted to a uniform distribution, where the signal input vectors are evenly distributed within the N-dimensional vector space.

Signal redundancy may be exploited to compress the input vectors and thus save appreciable bandwidth if transmission or storage of the input vectors is required. For example, if a set of signal vectors is highly redundant it is efficient to represent a "clustered" vector group by one representative output vector. Instead of transmitting or storing a large number of slightly different input vectors, one representative output vector close to all of the input vectors in a clustered group can be transmitted or stored.

Clearly, using a vector quantization method, a representation of a set of input vectors can be transmitted or stored much more efficiently than the original set. It will be appreciated that a crucial step in effective vector quantization is the design of the vector quantizer, i.e., determining the particular output vectors that will represent the input vectors. One goal of the design process is to produce a set of output vectors that closely represent the input vectors so that the decoded vector information exhibits a minimum loss of fidelity from the original information.

Generally, the design of a vector quantizer is accomplished by feeding a long training sequence of signal input vectors into a vector quantizer design system. From a training sequence, a vector quantizer codebook is constructed to code and decode future input signals. The training sequence is meant to statistically represent future sets of input vectors as accurately as possible. It will be appreciated then that each vector quantizer codebook is highly specialized for a particular type of signal set.

Typically, the design of a vector quantizer begins with the initialization of a set of output vectors that are based upon the training sequence of input vectors. A total distortion measure, generally a summation of the error or distance between each input vector in the training sequence and its representative output vector, is calculated. If the total distortion level is greater than a predetermined acceptable distortion threshold, the output vectors are readjusted in accordance with the training sequence of input vectors such that the total distortion is decreased. Alternatively, the number of output vectors may be increased and all output vectors readjusted to lessen the total distortion. The readjustment process continues until the total distortion is at the acceptable level.

As the available number of output vectors increases, the accuracy of the representation will increase. However, as the number of output vectors increases, the corresponding data compression rate decreases. Consequently, the computational requirement during vector quantization is increased, due to the larger number of output vectors the vector quantizer must compare to each input vector. Thus, a constraint optimization problem is presented with the constraints including required data compression, acceptable distortion level, and computational limitations.

Another measure of the performance of a vector quantizer is its ability to handle "outliers". Outliers are the input vectors which are far from any clustered group of input vectors. Conventional vector quantizer design systems generally rely on the use of a centroid measure of the training sequence to determine or readjust the output vectors. For example, given a set of input vectors, an output vector will be set equal to the centroid of the group. The concept is that a centroid measure minimizes distortion for a given group. However, for certain distributions, a centroid measure may not accurately represent the population. For example, in a heavy-tailed distribution, the centroid measure produces an output vector approximation that does not accurately characterize the center ("location") of the distribution. Therefore, to produce a robust vector quantizer, one which can adequately handle outliers, a method other than centroid representation for determining the output vectors must be used.

The present invention employs a neural-network simulation method and apparatus for adjusting output vectors to produce a high data compression, low distortion robust vector quantizer.

SUMMARY OF THE INVENTION

In accordance with the present invention, a vector quantizer design method and apparatus that allows efficient and low distortion transmission, storage, and/or recognition of signals is provided. The method involves the application of a neural-network simulation and neighborhood function to design a robust and efficient vector quantizer. Using these concepts, each output vector is sensitive to the entire input vector distribution unlike prior vector quantizer design wherein output vector positioning may be based on a limited subset of the input vectors.

The design system includes an initialization stage and a splitting and optimization stage. In the initialization stage, a training sequence of input vectors are obtained and stored. An initial output vector is defined as the centroid of the entire set of input vectors. In the splitting and optimization stage, the initial output vector is split into two output vectors. Then, for each input vector, the output vector that is nearest to the input vector is selected to be associated with the input vector. The associated output vector is readjusted, along with a set of related output vectors, as a function of the associated input vector. After each of the input vectors is associated with an output vector, the total distortion between the input and output vector sets is calculated. If the total distortion is not at an acceptable level then the association and readjustment procedure is repeated. A different set of related output vectors are readjusted during each iteration of the association and readjustment step.

To determine which set of related output vectors will be readjusted, a neighborhood function is used. The neighborhood function is derived from a neural-network simulated by the present invention. The neural-network is simulated by relating each input vector to each output vector via a single-layer perceptron model. An input vector is related to each output vector for the operations of association with and readjustment of the output vectors. The simulation involves the formation of a two-dimensional grid of all the output vectors. The neighborhood identifies the output vectors adjacent to an associated output vector to be readjusted when the associated output vector is readjusted. Initially, the neighborhood is defined so that the neighborhood grid contains all output vectors in the perceptron model. As the design progresses, i.e., each time the total distortion level is acceptable, the neighborhood is reduced. At the last iteration, when the neighborhood includes only the associated output vector, only that output vector is readjusted in accordance with its associated input vectors and thus will likely be closely representative of the group of input vectors. The neural-network simulation and the neighborhood function thus identify the set of related output vectors that are readjusted. In this manner, the output vector set is sensitive to the entire input vector distribution and the resulting vector quantizer is robust.

When the neighborhood reaches zero, each output vector is split into two new output vectors, and the entire splitting and optimization stage is repeated. The quantizer design is complete when the number of output vectors is equal to the predetermined number of output vectors allowable by the vector quantizer. The number of output vectors is determined by the necessary data compression rate and allowable distortion level.

The simulation of the neural-network ensures that the vector quantizer is robust. Outliers in the input training sequence are suitably represented by output vectors since the output vectors are readjusted according to a neighborhood which is continuously reduced in size. Input vector clusters, as well as outliers, are well represented by one or more output vectors.

In accordance with other aspects of the present invention, the total distortion is measured by the sum of the distances from each input vector to its corresponding associated output vector. If the total distortion reaches a steady state or satisfies an optimization constraint, then the total distortion is acceptable. Otherwise, the entire process of associating each input vector with the nearest output vector and readjusting the associated output vector and neighborhood of output vectors is repeated.

In accordance with still further aspects of the present invention, when the neighborhood reaches zero, each output vector is split into two new output vectors using a preset perturbation value and the steps of association and readjustment are repeated.

In accordance with further aspects of the present invention, an additional step in the design method, after the predetermined number of output vectors is reached, is the elimination of output vectors that have no associated input vectors. Furthermore, if two output vectors are sufficiently close to one another, one of the output vectors is eliminated and all input vectors associated with the eliminated output vector are associated with the output vector that was not eliminated.

In accordance with still other aspects of the present invention, a final optimization step is performed if any output vector was eliminated due to lack of association. The final step entails, once again, the association of each input vector to its nearest output vector. Each output vector is then readjusted, the total distortion is calculated, and the entire process is repeated until the total distortion level reaches a steady state. At this point, the vector quantizer design is complete; the output vector set forms the codebook which is the primary output of a vector quantizer.

Additional objects and features of the invention will appear from the following description in which the preferred embodiments of the invention have been set forth in detail in conjunction with the drawings.

DESCRIPTION OF THE PREFERRED EMBODIMENTS

Figure 1:
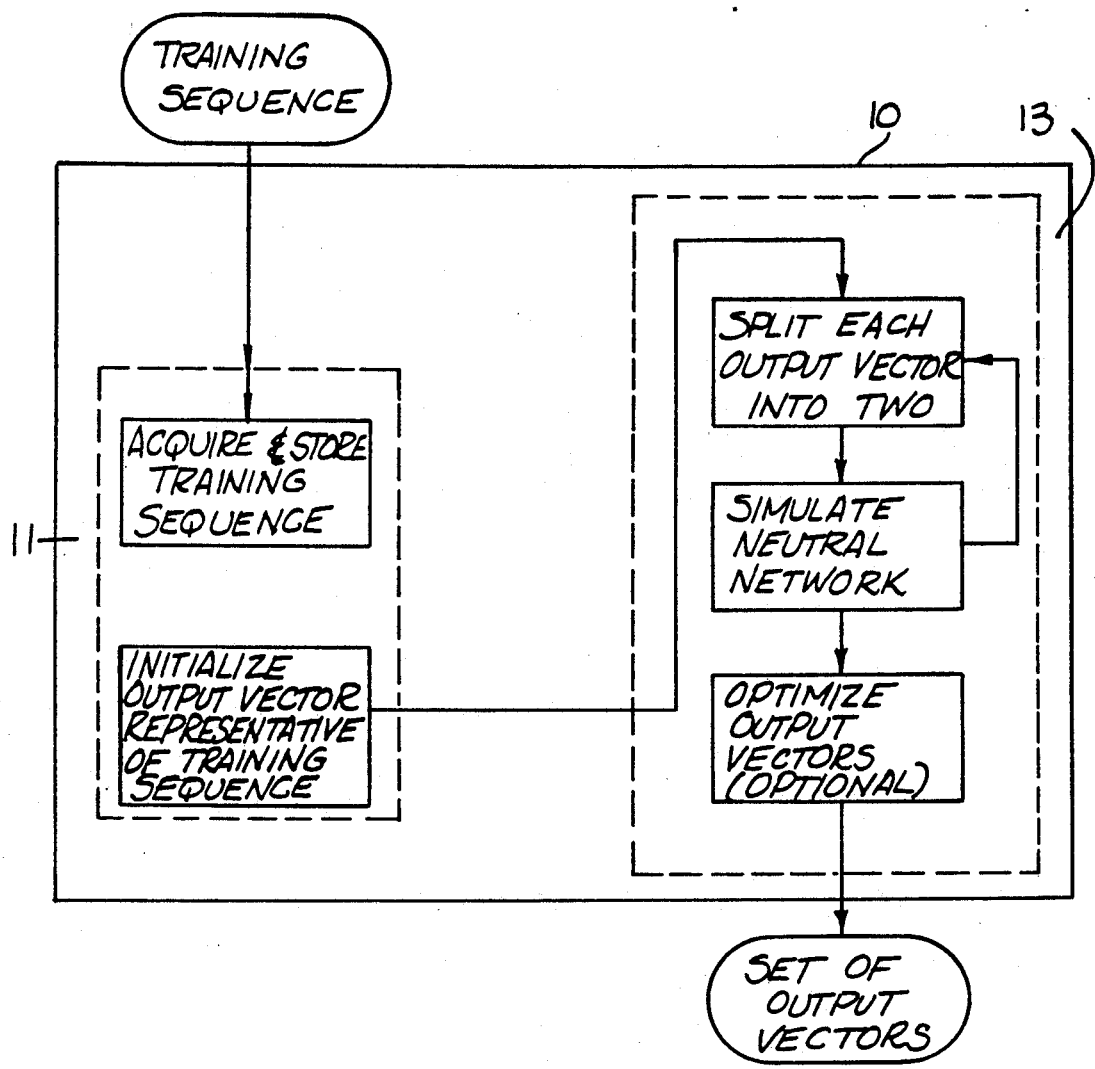
FIG. 1 is a vector quantizer design system in accordance with the present invention.

With reference to FIG. 1, in accordance with the present invention, a vector quantizer design system 10 includes two primary stages. The initialization stage 11 includes the step of acquiring a training sequence of input vectors representative of future input vectors. Furthermore, in the initialization stage 11, the training sequence is used to determine a first output vector which is representative of the training sequence. The vector quantizer design system also includes a splitting and optimization stage 13 that includes the steps of splitting each output vector into two new output vectors and optimizing the set of output vectors based upon the training sequence of input vectors by simulating a neural-network. The splitting and neural-network simulation step are repeated until the desired number of output vectors equals a predetermined maximum number. By simulating a neural-network, each output vector is affected at some point by each input vector in the training sequence, resulting in a robust output vector set. The product of the vector quantizer design system is a set of output vectors that are representative of the training sequence and thus will be representative of similar sequences of input vectors. A final optional optimization step is carried out against the output vectors in the splitting and optimization stage 13.

Figure 2:
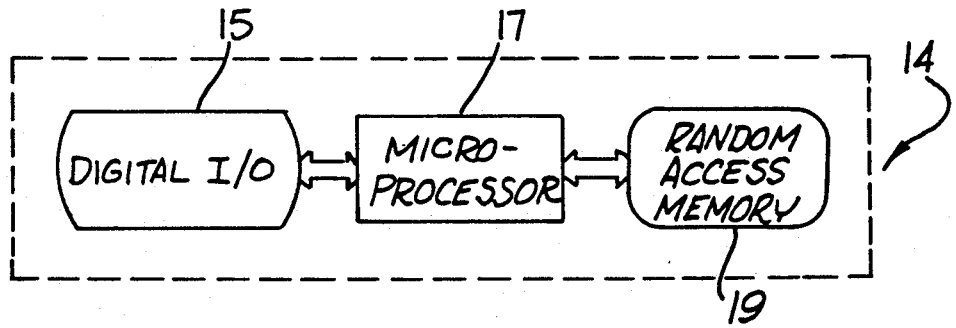
FIG. 2 is a system suitable for implementing a vector quantizer design system in accordance with the present invention.

With reference to FIG. 2, in one actual embodiment the vector quantizer design system is implemented by a control system 14 including a digital Input/Output (I/O) interface 15, a microprocessor 17, and Random Access Memory (RAM) 19. The digital I/O interface 15 is of parallel or serial type and the RAM 19 is of sufficient size to handle large amounts of data. The microprocessor 17 has overall control of the system and oversees the execution of the design system.

Figure 3:
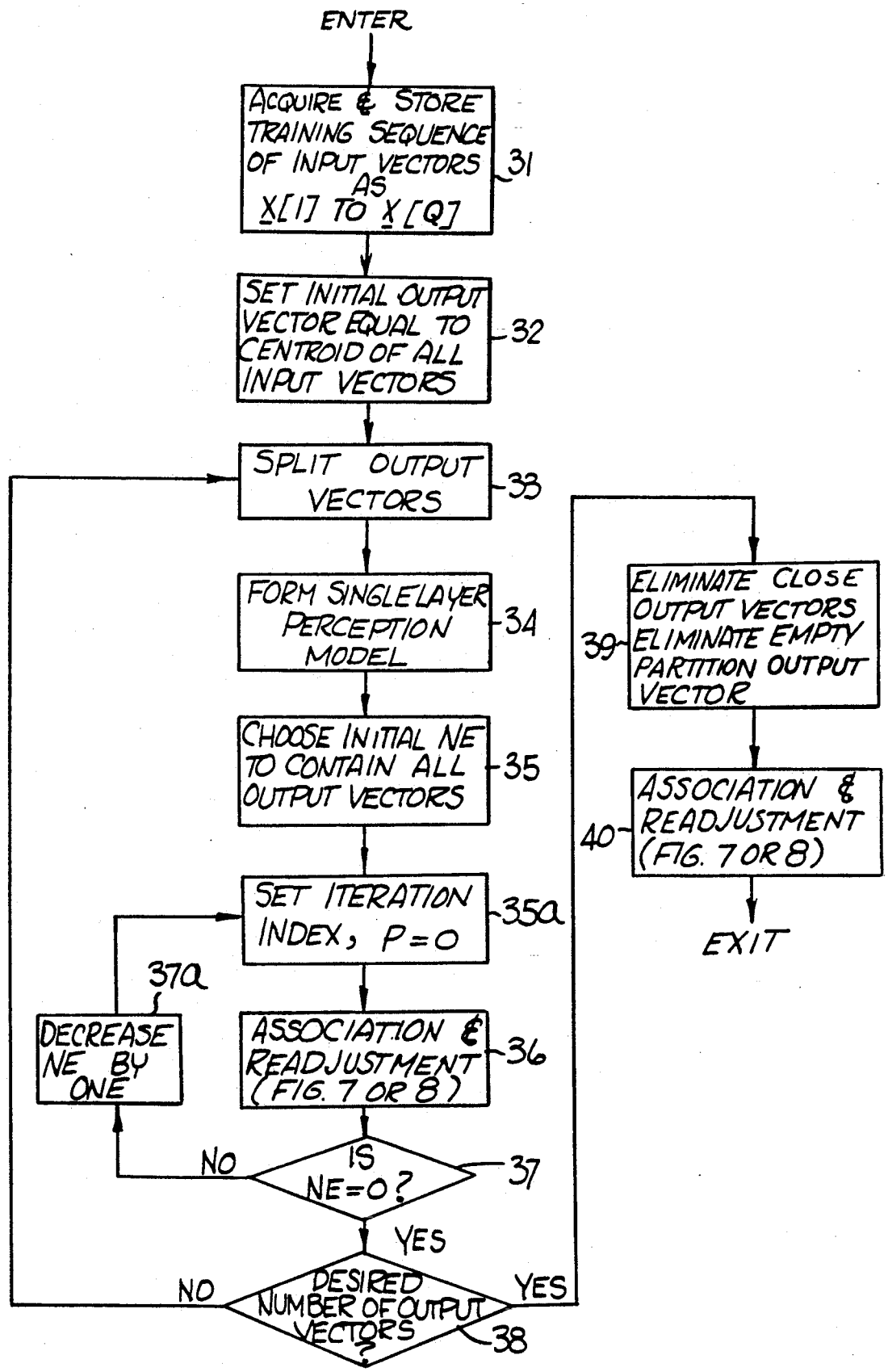
FIG. 3 is a flow diagram of a vector quantizer design method in accordance with the present invention.

Referring to FIG. 3, one method of designing a vector quantizer in accordance with the present invention can be seen. Initialization 11 of the vector quantizer is accomplished in boxes 31–32, splitting and optimization in boxes 33–38, and an optional final optimization at boxes 39 and 40. Specifically, in box 31 the design system acquires and stores the entire training sequence of input vectors. Acquisition of the training sequence involves the gathering of a large set of sample signals of a given class. For example, if the class of signals to be quantized is human speech, it is necessary to gather actual speech samples from human speakers or to simulate such samples. In fact, in one application of the present invention, thousands of speech samples were obtained. Each set of samples (10 msec in duration) was digitally processed to produce a 14-dimensional vector to be used in a training sequence. Ideally, the training sequence statistically represents the future set(s) of input vectors that the particular vector quantizer is designed to quantize. It will be appreciated that each vector quantizer is designed specifically for a single class of signals. Further, it is preferable that the training sequence be as large as possible. If the training sequence is extremely large, the statistical representation is more accurate and accordingly the distortion level will be lowered and the ability of the vector quantizer to recognize future inputs is enhanced. However, the longer the training input sequence, the greater the computational requirements during the vector quantizer design process.

The training sequence of input vectors is stored in an array of vectors denoted by $\underline{X}[q]$, where q is the index of the input vectors between 1 and Q, and Q is the total number of input vectors in the training sequence. Further, each input vector is composed of a multiple number N of scalar elements and is referred to as an N-dimensional vector.

In the next box 32, the output vector set is initialized. To select an initial output vector set representative of the training sequence, the centroid $\underline{W}[c]$ of the entire set of input vectors is calculated by:

$$\underline{W}[c] = \frac{1}{Q} \sum_{q=1}^{Q} \underline{X}[q]. \tag{1}$$

An initial output vector $\underline{W}[1]$ is then set equal to $\underline{W}[c]$. In the following box 33, each output vector $\underline{W}[i]$, for i=1 to the current number of output vectors M, is split to form two output vectors, $\underline{W}[a]$ and $\underline{W}[b]$, in accordance with the following set of equations:

$$\underline{W}[a] = \underline{W}[i] + \delta_1 \underline{W}[i]; \quad \underline{W}[b] = \underline{W}[i] - \delta_1 \underline{W}[i]. \tag{2}$$

where $\delta_1$ is a constant predetermined perturbation value. In one actual embodiment, the perturbation value $\delta_1$ is generally on the order of 0.008. It will be appreciated that after the initial calculation of the centroid $\underline{W}[c]$, at box 32, there is only the initial output vector $\underline{W}[1]$ to split into new $\underline{W}[1]$ and $\underline{W}[2]$. However, as the design process progresses, the number of output vectors will increase.

As an example of the splitting mechanism at box 33, assume the simplest case of having only the single output vector $\underline{W}[1]$. The vector $\underline{W}[1]$ is split into two new vectors which are denoted by $\overline{W}[1]$ and $\underline{W}[2]$, formed in accordance with Equation (2) above. The slightly more complex example of splitting four output vectors, $\underline{W}[1]$, $\underline{W}[2]$, $\underline{W}[3]$, and $\underline{W}[4]$ produces the set of output vectors $\overline{W}[i]$, for i=1 to 8. In that case, $\underline{W}[1]$ will be split into vectors $\underline{W}[1]$ and $\underline{W}[2]$. Similarly, $\overline{W}[2]$ will be split into vectors $\overline{W}[3]$ and $\overline{W}[4]$, $\underline{W}[3]$ will be split into vectors $\underline{W}[5]$ and $\overline{W}[6]$, and finally $\underline{W}[4]$ will be split into vectors $\underline{W}[7]$ and $\underline{W}[8]$. The new vector set is preferably ordered in such a sequential manner to maintain the paired relationship between the two new vectors formed from a single old vector.

By splitting each original output vector into two new output vectors, two goals are simultaneously attained. First, splitting serves as a mechanism for obtaining the predetermined number of output vectors in an ordered, controlled manner. Second, by using the original output vector as the basis for the new output vectors, the training sequence's effect on the original output vector's values in prior optimizations is retained.

At the next box 34, a single-layer perceptron model is formed. The single-layer perceptron is known to those skilled in the art and others as a method for simulating a neural-network. Such use is described generally in *Principles of Neurodynamics*, by Rosenblatt, Spartan Books, New York 1959. The simulation is accomplished by artificially forming the single-layer perceptron model shown in FIG. 4. The single-layer perceptron model of a neural-network consists of an upper layer of output nodes denoted by $\underline{W}[1]$ through $\underline{W}[M]$, $M=16$ in the figure example, arranged in a two-dimensional grid connected to a plurality of input nodes denoted by $\underline{X}[1]$ through $\underline{X}[Q]$. Each input node is connected to each output node. Because of the connections between the input and output nodes, each output node is affected by every input node. It will be appreciated that the set of output vectors and the training sequence of input vectors of the present invention are analogous to the output and input nodes, respectively, of FIG. 4.

The single-layer perceptron model is formed by first creating the artificial 2-dimensional grid of output vectors. Initially, the set of output vectors may be arranged in the RAM 19 as a linear sequential array from $\underline{W}[1]$ to $\underline{W}[M]$. Because of the splitting procedure described in conjunction with box 33, the number of output vectors M at any particular time will always be a power of 2. The number of output vectors M is thus either a perfect square or one-half of a perfect square.

Figure 5A:
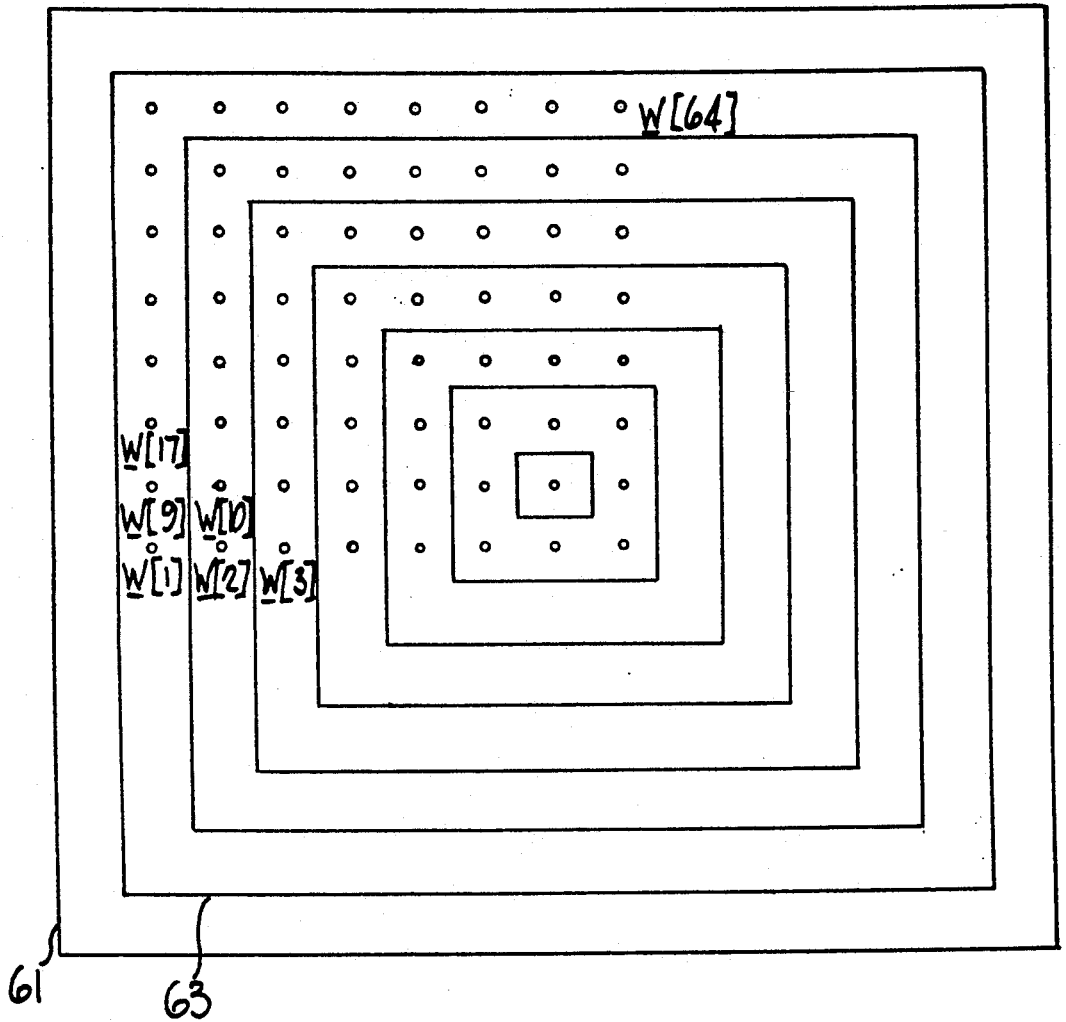
FIGS. 5A and 5B are diagrammatical depictions of the output vector grids formed in accordance with the simulated single-layer perceptron model of FIG. 4.
Figure 5B:
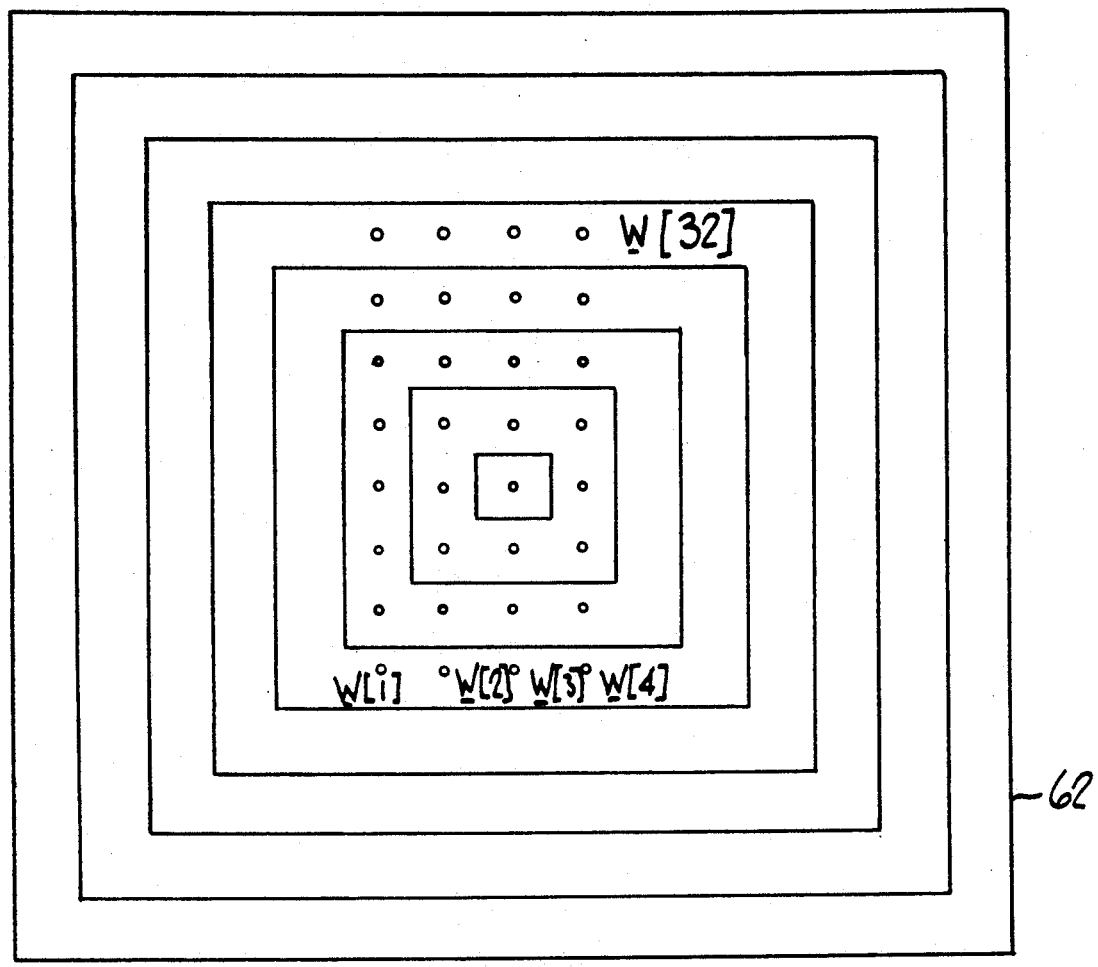

With reference to FIGS. 5A and 5B, which depict examples of output vector grids, the sequential linear array is reformed into a 2-dimensional grid in which either the X-dimension and the Y-dimension are equal, i.e., M is a perfect square, or in which the X-dimension is one-half of the Y-dimension, i.e., M is one-half of a perfect square. The specific dimensioning of the 2-dimensional grid is determined by the number of output vectors M. For example, if the set of output vectors consists of only two output vectors, the 2-dimensional grid would be a 1×2 rectangle to accommodate both vectors. As illustrated in FIG. 5A, if there are sixty-four output vectors, the array formed is a 8×8 grid. For the case of thirty-two output vectors, as shown in FIG. 5B, the array formed is now 4×8 and is thus, one half of a perfect square.

Figure 6:
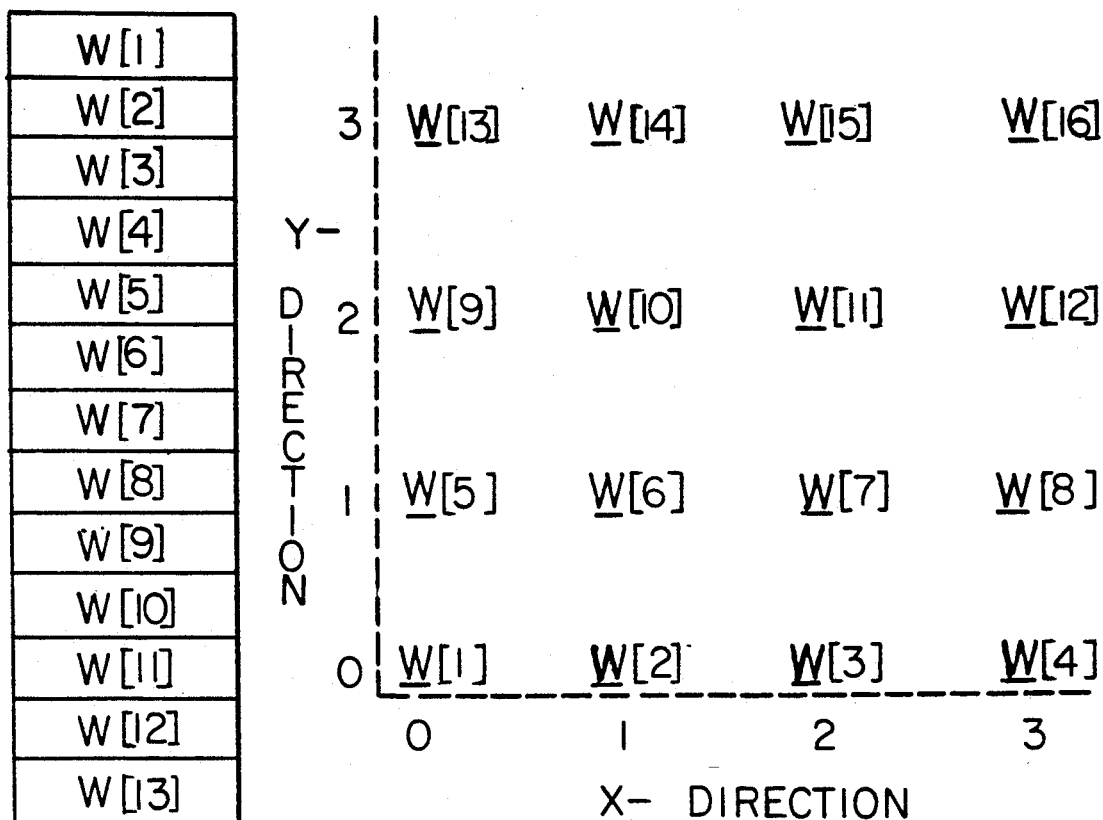
FIG. 6 is a schematic diagram of the output vector set in a linear array arrangement and in a grid array arrangement in accordance with the present invention.

With reference to FIG. 6, to form the 2-dimensional grid from the linear sequential array of vectors, the first output vector is placed in the lower left-hand corner of the array, the second output vector is placed on the same vertical level and displaced along the positive X-axis one unit, the third output vector along the same vertical level and displaced along the X-axis another unit, and so on until the X-dimension is completely filled. At that time, the next Y-level is filled, etc., until the entire 2-dimensional grid is complete. This method retains some of the intravector relationships of the linear array, i.e., new output vector pairs from the splitting step are adjacent one another in the 2-dimensional grid. The exact method of filling the grid is not critical to the neural-network simulation. For example, the grid may be formed wherein the first output vector is placed in the upper left-hand corner and filled in a "left-right", "top down" manner. The important consideration is that the linear array of output vectors is arranged consistently using one scheme throughout the entire design process.

With reference again to FIG. 3, in box 35, a neighborhood NE is established in relation to the 2-dimensional grid. The neighborhood defines the output vectors in the 2-dimensional grid that are affected by, i.e., readjusted in relation to, each input vector. The dimensions of the grid formed at box 34 determine the initial size of a neighborhood NE. The neighborhood NE is initially set equal to the largest of the grid dimensions minus one. For example, in FIG. 5A, an 8×8 grid has been constructed from sixty-four output vectors. Thus, the initial neighborhood NE surrounding a particular output vector is all output vectors within seven grid units separation. The largest square box 61 in FIG. 5A represents the initial neighborhood NE. A similar seven grid neighborhood NE, shown as box 62, would be initialized in the 8×4 grid of FIG. 5B.

After the simulated neural-network model is complete, an iteration index P is set to zero at box 35A. The association and readjustment in box 36 is then performed. With reference to the detailed flow diagram of FIG. 7, the iteration index P is incremented by one in box 41. The iteration index P counts the number of times the association and readjustment steps in box 36 are carried out. Next, in box 42, beginning with $q=1$, the Euclidean distance $d_{iq}$ from the input vector $\underline{X}[q]$ to all of the output vectors $\underline{W}[i]$, for $i=1$ to M, is calculated as:

$$d_{iq} = \frac{1}{N} \sum_{n=1}^{N} (w_{ni} - x_{nq})^2, \quad (3)$$

where $w_{ni}$ and $x_{nq}$ represent scalar elements of a vector. For example, $w_{24}$ is the second scalar element of the fourth output vector $\underline{W}[4]$ and and $x_{31}$ is the third scalar element of the first input vector $\underline{X}[1]$.

Next, in box 43, the input vector $\underline{X}[q]$ is associated with its nearest output vector, as determined by selecting the minimum distance from the distances $d_{iq}$, for $i=1$ to M, calculated by Equation (3). The nearest output vector and the input vector $\underline{X}[q]$ are said to be "associated" vectors. The associated output vector is annotated as $\underline{W}[A]$. This association is part of the relationship represented by the connections between the input and output nodes illustrated in FIG. 4. Next, in box 44, the associated output vector $\underline{W}[A]$ is then readjusted as follows:

$$\underline{W}[A] = \underline{W}[A] + \eta(\underline{X}[q] - \underline{W}[A]). \quad (4)$$

According to Equation (4), the associated output vector $\underline{W}[A]$ is linearly readjusted in relation to the input vector $\underline{X}[q]$. The term $\eta$ is a gain term between zero and one and is determined by the following equation:

$$\eta = \frac{1}{\sqrt{2\pi}} e^{\left(\frac{-(P-1)^2}{2}\right)} e^{\left(\frac{-(k)^2}{2}\right)}. \quad (5)$$

The gain term $\eta$ is a value dependent upon the iteration index P and the Euclidean distance k, which is the distance between the output node of the output vector $\underline{W}[i]$ and the output node of the output vector closest to the input vector $\underline{X}[q]$, and is always between 0 and 1. Although the definition of $\eta$ is somewhat arbitrary in its form, it will be appreciated that other definitional equations for $\eta$ which converge to 0 would be suitable. The readjustment of the associated output vector tends to move the associated output vector closer (spatially) to the input vector. In this manner, the distortion, as measured by the spatial distance between the input vector and the associated output vector, is reduced and vector quantizer performance is enhanced.

In box 45, all output vectors within the neighborhood NE of the associated output vector $\underline{W}[A]$ are readjusted according to Equation (4), wherein each output vector W[i], for i=1 to the neighborhood NE, replaces W[A] in Equation (4). Referring once again to FIG. 5A, assuming the 2-dimensional grid is an 8×8 square, then in the first iteration the neighborhood NE is seven and all output vectors within seven grid units of the associated output vector are readjusted. In this manner, the input vector X[q] affects the output vectors which are the neighbors, i.e., within neighborhood NE, of the associated output vector W[A] in the 2-dimensional grid. Each neighborhood output vector is positioned closer to the input vector by the readjustment. This readjustment process is part of the relationship represented by the connections between the input and output nodes illustrated in FIG. 4.

The entire process described in boxes 42–45 is repeated for each input vector, q=1 to Q, until the last input vector has been considered at box 46. Once each input vector has been considered, each input vector is associated with an output vector. The total distortion $D_P$ between the input vectors and their associated output vectors is then calculated in box 47 by:

$$D_p = \frac{1}{Q} \sum_{q=1}^{Q} (\min d_q), \qquad (6)$$

wherein min $d_q$ denotes the distance between the qth input vector and its associated output vector, and $D_p$ represents the total distortion after the $P^{th}$ iteration. The total distortion value $D_P$ is then compared to the distortion value for the previous iteration. A relative distortion value $D_T$ is described as a percentage as follows:

$$D_T = (D_{P-1} - D_P)/D_P \qquad (7)$$

On the initial pass through boxes 41–47 there is no previous distortion value and $D_{P-1}$, for P=1, is set as infinity. If, at box 49, the relative distortion value $D_T$ is less than an optimization threshold $\delta_2$, the classification and optimization procedure is completed. However, if the relative distortion value $D_T$ is greater than the optimization threshold $\delta_2$, the entire process described in relation to boxes 41–47 is repeated until the total distortion level $D_P$ reaches a steady state relative to the previous iteration. It can be appreciated that once steady state has been reached, any further improvement in the total distortion $D_P$ is negligible. In one actual embodiment, the optimization threshold $\delta_2$ is generally on the order of 0.001 or 0.1%. The range is determined by trial and error, balancing design speed with distortion tolerance. For example, if the optimization threshold $\delta_2$ is overly high, i.e. 10%, the threshold condition will be satisfied relatively early in the design process, thus saving considerable computing time. However, the distortion exhibited by such a design may be excessively high. Alternatively, if the optimization threshold $\delta_2$ is overly low, i.e. 0.01%, the threshold may not be satisfied until large amounts of computing time are expended.

Figure 7:
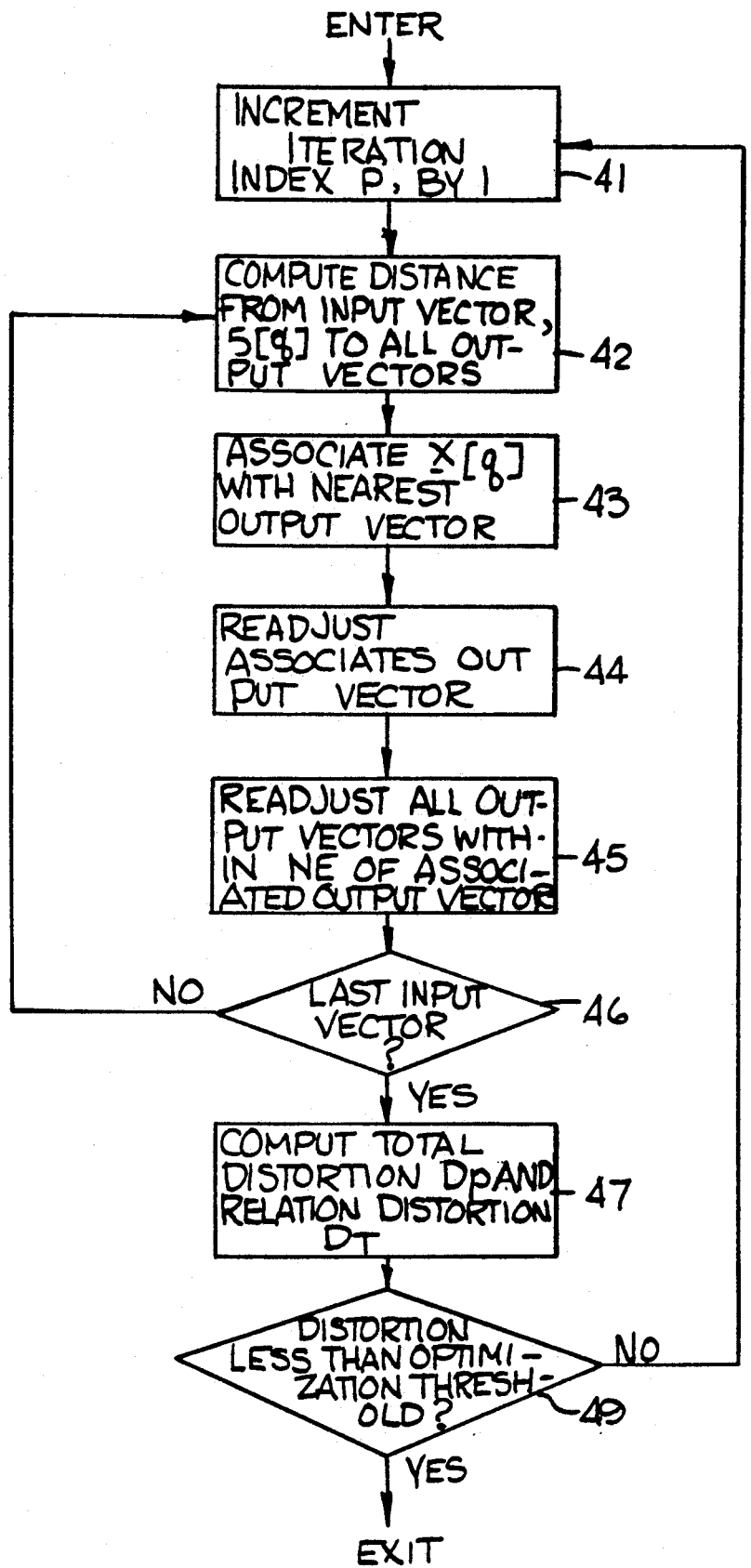
FIG. 7 is a detailed flow diagram of a splitting and optimization stage of the vector quantizer design method of FIG. 3.

Referring to FIG. 3, after the process of box 36 is complete and an acceptable distortion level is achieved, at box 37 a check is made to determine if the neighborhood NE is equal to zero. If the neighborhood NE is not equal to zero, the size of the neighborhood is decreased by one at box 37A. Such a decrease is illustrated in FIG. 5A from box 61 to box 63. The iteration index P is reset to zero at box 35A and the entire process of association and readjustment of the output vectors shown in FIG. 7 is repeated. The process described in relation to boxes 35A through 37A is performed once for each neighborhood size. Referring to FIGS. 5A and 5B, it can be appreciated that for a few iterations all of the output vectors are included in the neighborhood of each other output vector and are thus readjusted in relation to each input vector. Specifically, as seen in FIG. 5A, in the first two iterations, all of the output vectors are included in the neighborhood NE equal seven and hence all output vectors are readjusted in box 45 of FIG. 7. The number of iterations where all output vectors are readjusted is dependent upon the neighborhood size and upon which output vector in the 2-dimensional grid serves as the associated output vector.

Referring again to FIG. 3, following the satisfaction of the neighborhood NE equal zero condition in box 37, the design system determines in box 38 whether the number of output vectors is equal to the desired number of total output vectors L, i.e., if M=L. If the number of output vectors L has not been reached, the entire process, beginning at box 33, is repeated. The total number of iterations for the processes beginning in box 33 is therefore equal to $\log_2 L$. After each step of splitting the output vectors, the linear array of output vectors is doubled in size. Therefore, the 2-dimensional grid used for determining the neighborhood NE is reconstructed after each splitting in box 34.

The total number of output vectors L is a constraint which is determined at the outset of the vector quantizer design method. It follows that the larger the number of output vectors L, the lower the data compression. It can be seen that if there are thirty-two output vectors, at least 5 bits are required to transmit or store a code representing an output vector. However, if 512 output vectors are used, at least 9 bits are required to transmit or store the code. Therefore, the fewer the output vectors, the greater the data compression. However, if the number of output vectors L is constrained to a value which is overly low, the distortion between the output vectors and the input vectors may be unacceptably high. If the distortion is high, the decoded vector data may not adequately represent the original input vector data.

In one actual embodiment of the present invention, once the number of output vectors L has been reached, two additional output vector elimination steps are performed at box 39. One step is to rearrange the output vectors such that a more efficient set of output vectors is obtained. There may exist two vectors, W[a] and W[b], which are very close together, i.e. their distance is less than a rearrangement threshold $\delta_3$. One of these vectors can be eliminated without adversely affecting the overall distortion level. The rearrangement value between each output vector W[a] and every other output vector W[b] is calculated via the equation:

$$d_{ab} = \frac{1}{N} \sum_{n=1}^{N} (W[a]_n - W[b]_n)^2, \qquad (8)$$

where $W[a]_n$ and $W[b]_n$ are the $n^{th}$ scalar elements of output vectors W[a] and W[b], respectively. If $d_{ab}$ is less than the rearrangement threshold $\delta_3$, one output vector W[a] or W[b] is eliminated. For example, W[a] may be eliminated. The remaining output vector W[b] is the associated vector for its associated input vectors as well as for those input vectors previously associated with the output vector W[a]. The rearrangement threshold $\delta_3$ is selected so that the total distortion level for the output set relative to the input set remains at an acceptable level.

In a second elimination step, "empty partitions," i.e., output vectors that are not associated with any input vector, are eliminated. Thus, if elimination due to "closeness" or "empty partitions" occurs, a new set of output vectors, which contains fewer than L output vectors, is obtained. The new set of output vectors still exhibits the required distortion level. This efficient allocation of output vectors is advantageous since a minimum number of output vectors are used to represent a class of input signals within a distortion criterion. Furthermore, it can be appreciated that a reduced number of output vectors facilitates speedy operation of the vector quantizer.

If no elimination of output vectors takes place at box 39, the design is complete. Otherwise, a last association and readjustment in box 40 is performed. Each input vector in the training sequence is associated with an output vector and only the associated output vector is readjusted according to Equation (4). At the completion of this procedure, there is a number of output vectors L less any output vectors which were eliminated in the rearrangement stage at box 39.

The resultant set of output vectors forms a portion of a codebook. When the codebook is utilized, an input vector is mapped to the nearest output vector. A set of coded output vectors is then used to represent the set of input vectors. Any receiver having a copy of the codebook will be able to recreate the input signals from the code, within a distortion level specified during the vector quantizer construction.

Figure 4:
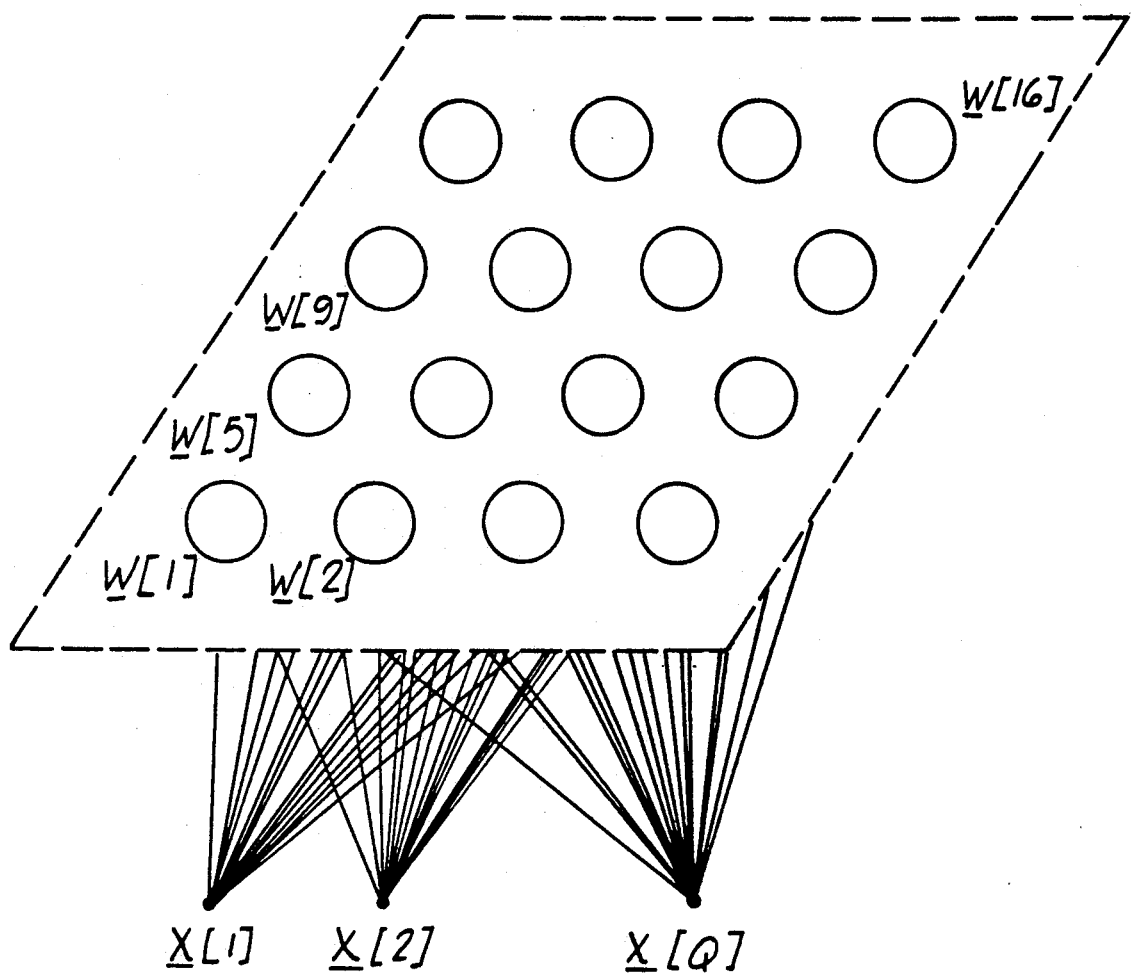
FIG. 4 is a simulated single-layer perceptron model for relating a training sequence of input vectors with a set of output vectors using the vector quantizer design method of FIG. 3.
Figure 8:
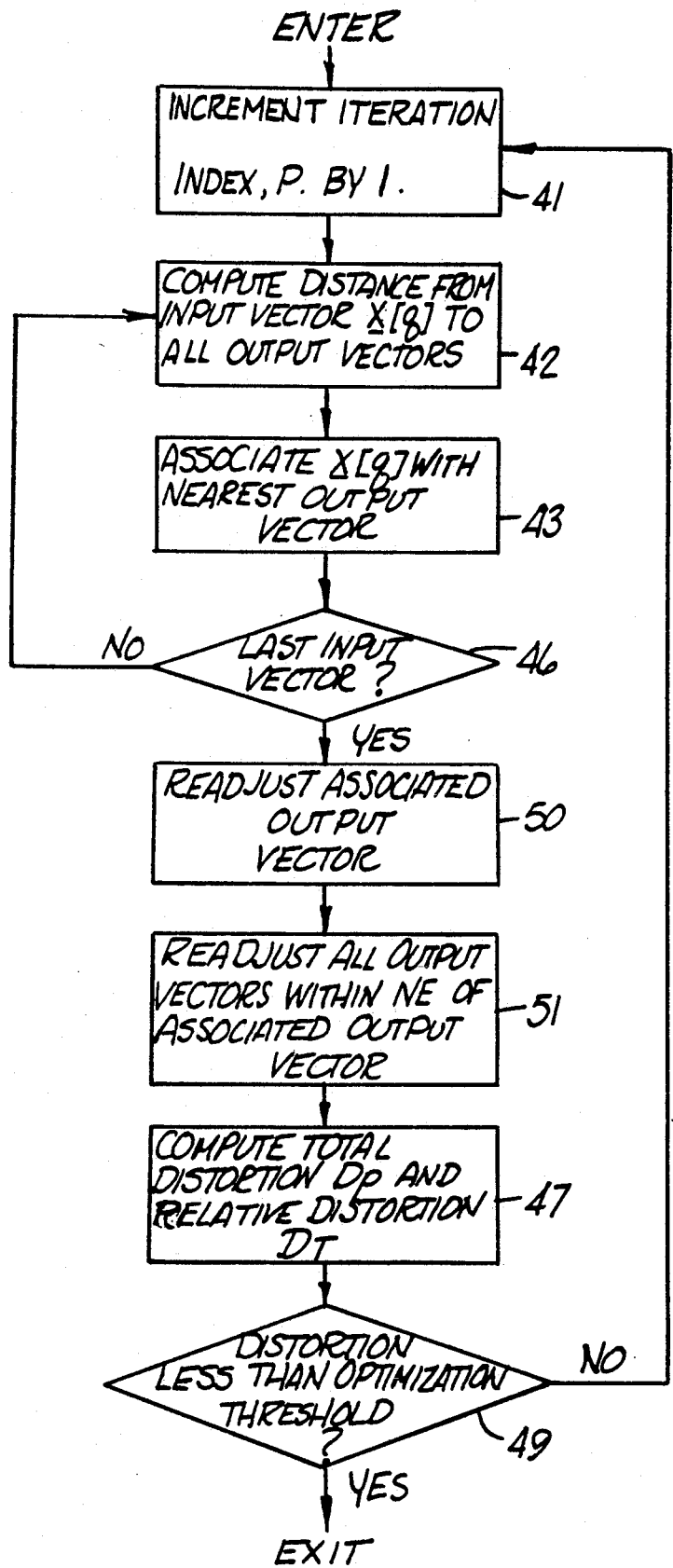
FIG. 8 is a detailed flow diagram of an alternative splitting and optimization stage of the vector quantizer design method of FIG. 3.

In an alternative preferred embodiment of the invention, the vector quantizer design system is implemented in a parallel fashion rather than a serial fashion. Such an implementation increases the speed of the design by taking advantage of the parallel processing characteristic inherent in neural-network systems. The parallelism of neural-network systems is illustrated in FIG. 4 by the identical connections that exist between each input node and each output node. The parallel implementation of the invention is similar to the serial implementation of the invention except that at the optimization stage the output vectors are readjusted in one or more groups rather than one at a time. With reference to FIGS. 7 and 8, the portions of the serial and parallel implementation that are the same are identified with identical reference numbers.

With reference to FIG. 8, during a parallel implementation, the distance from each input vector $\underline{X}[q]$ to all output vectors is calculated, at box 42, and each input vector is associated with the nearest output vector, at box 43, before any readjustment takes place. At box 46, the system checks the condition of whether each input vector has been analyzed and loops back to box 42 if the condition fails. Once all of the input vectors have been analyzed, each output vector is associated with a set of associated input vectors. Of course, an output vector's set of associated input vectors will be empty if the output vector is an empty partition. At box 50, each output vector is readjusted according to Equation (4) for each of the associated input vectors $\underline{X}[q]$ that is in the output vector's set of associated input vectors. Each output vector is readjusted in parallel with some or all of the other output vectors. Further, at box 51, all output vectors within the neighborhood NE of any output vector are readjusted according to Equation (4), again, in a parallel fashion. Because of the similarity of the processes carried out at boxes 50 and 51, the processes can be combined into a single output vector readjustment process. Once all of the output vectors and their neighbors have been readjusted, the total and relative distortion levels are calculated at box 47. If the relative distortion value $D_T$ is less than an optimization threshold $\delta_2$, the entire process beginning at box 41 is repeated.

One system for providing parallel processing capabilities includes a series of processors, e.g., multiple microprocessors 17, that process simultaneously. For example, if ten processors are used, ten calculations can be performed at the same time. By using parallel processing techniques, the readjustment of the output vectors either in their capacity as an associated output vector, at box 50, and/or as a neighbor to an associated output vector, at box 51, can be performed in parallel. The speed of such a readjustment process is significantly increased over the serial processing implementation. Thus, the time required to carry out the optimization stage of the design system is greatly reduced. The parallel processing system produces a robust vector quantizer design that has the same benefits as the design that is produced by the serial system. While preferred embodiments of the invention has been illustrated and described, it will be appreciated that various changes can be made therein without departing from the spirit and scope of the invention.

The embodiments of the invention in which an exclusive property or privilege is claimed are defined as follows:

1. A method for designing vector quantizers performed by a computer system including a processor, an input/output component and memory, wherein said method is controlled by said processor, the method comprising the steps of:
   (a) acquiring via said input/output component training sequence of input vectors;
   (b) forming a set of output vectors comprised of an initial output vector representative of said training sequence;
   (c) splitting each of said output vectors in said set of output vectors into new output vectors, thereby forming a new set of output vectors;
   (d) initializing a neighborhood as a function of the number of output vectors said set of output vectors;
   (e) simulating a neural-network by arranging said set of output vectors as a single-layer perceptron model and storing said single-layer perceptron model in said memory;
   (f) for each of said input vectors, performing the substeps of:
      (i) associating an associated output vector to said input vector, termed associated input vector, wherein said associated output vector is an output vector that is closest to said associated input vector; and
      (ii) readjusting and storing in said memory said associated output vector and all output vectors within said neighborhood of said associated output vector as a function of said associated input vector;
   (g) calculating a relative distortion level for said output vectors and said input vectors;
   (h) repeating steps (f) and (g) until said relative distortion level is less than or equal to a preselected optimization threshold level;

(i) reducing said neighborhood incrementally and repeating steps (f)–(h) until said neighborhood is zero; and (j) repeating steps (c) through (i) until the number of output vectors in said set of output vectors equals a predetermined maximum number of output vectors, wherein each of said steps and substeps are controlled by the processor, and whereby said set of output vectors represents said training sequence.

2. The method as claimed in claim 1,
wherein said method includes the step of storing in said memory a prior distortion level equal to infinity after step (b), and
wherein said step of calculating a relative distortion level includes the steps of
(i) determining a total distortion level between said output vectors and said input vectors,
(ii) deriving a relative distortion level from said total distortion level and a prior distortion level, which is said relative distortion level calculated during a previous iteration of steps (f) and (g), and
(iii) setting said prior distortion level equal to said total distortion level.

3. The method as claimed in claim 1, wherein, after step (j), the method further comprises the steps of determining a rearrangement distance for each pair of output vectors and of eliminating from said memory one of said pair of output vectors if said rearrangement distance is less than a predetermined rearrangement threshold.

4. The method as claimed in claim 3, wherein the method further comprises repeating step (f) after said rearrangement distance is determined and said output vectors are eliminated.

5. The method as claimed in claim 3, wherein said rearrangement distance d is determined as:

$$d_{op} = \frac{1}{N} \sum_{n=1}^{N} (w_{no} - w_{np})^2$$

where N is the dimension of said output vectors, $w_{no}$ is the $n^{th}$ element of a $o^{th}$ output vector, $w_{np}$ is the $n^{th}$ element of a $p^{th}$ output vector, and $d_{op}$ is the distance from said $o^{th}$ output vector to said $p^{th}$ output vector.

6. The method as claimed in claim 1, wherein, after step (j), the method further comprises the step of eliminating any output vector from said memory which does not serve as said associated output vector to any input vector.

7. The method as claimed in claim 6, wherein the method further comprises repeating step (f) after said step of eliminating output vectors is performed.

8. The method as claimed in claim 1, wherein said step of forming said set of output vectors includes the steps of calculating the centroid $\underline{W}[c]$ of said training sequence by:

$$\underline{W}[c] = \frac{1}{Q} \sum_{q=1}^{Q} \underline{X}[q]$$

where Q is the number of input vectors, and $\underline{X}[q]$ is an input vector in said training sequence, and of setting an N-dimensional initial output vector equal to $\underline{W}[c]$, where N is the dimension of said input vectors.

9. The method as claimed in claim 1, wherein the step of splitting an output vector $\underline{W}[i]$ is done in accordance with:

$$\underline{W}[a] = \underline{W}[i] + \delta_1 \underline{W}[i], \quad \underline{W}[b] = \underline{W}[i] - \delta_1 \underline{W}[i]$$

where $\underline{W}[a]$ and $\underline{W}[b]$ are said new output vectors, and $\delta_1$ is a predetermined perturbation value.

10. The method as claimed in claim 1, wherein said single-layer perceptron is comprised of said output vectors arranged in a two-dimensional grid.

11. The method as claimed in claim 10, wherein said step of initializing said neighborhood is performqd by calculating the largest dimension of said two-dimensional grid and subtracting one therefrom.

12. The method as claimed in claim 1, wherein the step of associating an output vector $\underline{W}[i]$ to an input vector $\underline{X}[q]$ includes the step of calculating a distance $d_{iq}$ from an $i^{th}$ output vector to $q^{th}$ input vector as given by:

$$d_{iq} = \frac{1}{N} \sum_{n=1}^{N} (w_{ni} - x_{nq})^2$$

where N is the dimension of said input vectors, $w_{ni}$ is the $n^{th}$ element of the $i^{th}$ output vector, $x_{ng}$ is the $n^{th}$ element of the $q^{th}$ input vector and of selecting $\underline{W}[A]$ as the associated vector wherein $d_{Aq}$ is the smallest $d_{iq}$, for $i=1$ to the number of output vectors M.

13. The method as claimed in claim 1, wherein the step of readjusting an output vector $\underline{W}[A]$ includes the step of calculating a new output vector $\underline{W}[A]'$ by:

$$\underline{W}[A]' = \underline{W}[A] + \eta (\underline{X}[q] - \underline{W}[A])$$

where $\underline{X}[q]$ specifies said associated input vector and $\eta$ is a predetermined gain term.

14. The method as claimed in claim 13, wherein said method includes the step of setting an iteration index P to zero when said neighborhood is initialized and incrementing said iteration index P each instance step (f) is repeated, and wherein said gain term $\eta$ is given by $$\eta = \frac{1}{\sqrt{2\pi}} e^{\left(\frac{-(P-1)^2}{2}\right)} e^{\left(\frac{-k^2}{2}\right)},$$

where k is the distance between an output node of an output vector $W[i]$ and an output node of an output vector closest to an input vector $X[q]$.

15. The method as claimed in claim 2, wherein said method includes the step of setting an iteration index P to zero when said neighborhood is initialized and incrementing said iteration index P each instance step (f) is repeated, and wherein said step of determining a total distortion level $D_P$ includes the step of measuring the sum of each of the distances from associated input vector and output vector pairs and is given by:

$$D_P = \frac{1}{Q} \sum_{n=1}^{Q} (\min d_n),$$

where Q is the number of input vectors in said training sequence.

16. The method as claimed in claim 15, wherein said relative distortion level $D_T$ is derived by:

$$D_T = \frac{D_{P-1} - D_P}{D_P}.$$

17. The method as claimed in claim 1, wherein said associating step (f)(i) is performed for each input vector before said readjusting substep (f)(ii) is performed, such that at the completion of step (f)(i) each output vector is associated with a set of associated input vectors, and said readjusting step (f)(ii) is performed in parallel for a group of said output vectors, such that each associated output vector in said group and all output vectors within said neighborhood of said associated output vector are readjusted as a function of said associated input vectors at substantially the same time as all other output vectors in said group are readjusted.

18. The method as claimed in claim 1, wherein said steps (f)(i) and (ii) are performed sequentially for each input vector.

19. A vector quantizer design system comprising:
  (a) an input/output component for receiving a training sequence of input vectors;
  (b) a memory;
  (c) processor control means for:
    (i) forming a set of output vectors comprised of an initial output vector representative of training sequence; and
    (ii) determining a set of output vectors by repeating, until the number of output vectors equals a predetermined maximum number of output vectors, the steps of:
      (1) splitting each of the output vectors in said set of output vectors into two new output vectors and thereby forming a new set of output vectors,
      (2) initializing a neighborhood as a function of the number of output vectors in said set of output vectors,
      (3) simulating a neural-network by arranging said set of output vectors as a single-layer perceptron model and storing said single-layer perceptron model in said memory,
      (4) performing, for each of said input vectors, the substeps of:
        (A) associating an output vector to said input vector wherein said associated output vector is the output vector closest to said input vector; and
        (B) readjusting and storing within said memory said associated output vector and all output vectors within said neighborhood of said associated output vector as a function of said input vector;
      (5) calculating a relative distortion level for said output vectors and said input vectors;
      (6) repeating steps (4) and (5) until said relative distortion level is less than or equal to a preselected optimization threshold level; and
      (7) reducing the neighborhood incrementally and repeating steps (1) through (6) until said neighborhood is zero,
whereby said set of output vectors represents the training sequence.

* * * * *

UNITED STATES PATENT AND TRADEMARK OFFICE
CERTIFICATE OF CORRECTION

PATENT NO.　：　5,255,346
DATED　　　：　Oct. 19, 1993
INVENTOR(S)：　Frank H. Wu and Kalyan Ganesan It is certified that error appears in the above-indentified patent and that said Letters Patent is hereby corrected as shown below:

Column 12, line 43:　after the word "into", insert --two--.

Signed and Sealed this

Fifth Day of July, 1994

Attest:

Attesting Officer

BRUCE LEHMAN

Commissioner of Patents and Trademarks